United States Patent
Tu et al.

(10) Patent No.: US 7,355,240 B2
(45) Date of Patent: Apr. 8, 2008

(54) SEMICONDUCTOR PRODUCT INCLUDING LOGIC, NON-VOLATILE MEMORY AND VOLATILE MEMORY DEVICES AND METHOD FOR FABRICATION THEREOF

(75) Inventors: Kuo-Chi Tu, Hsin-Chu (TW); Hsiang-Fan Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/233,344

(22) Filed: Sep. 22, 2005

(65) Prior Publication Data

US 2007/0063251 A1    Mar. 22, 2007

(51) Int. Cl.
*H01L 29/788* (2006.01)

(52) U.S. Cl. ............... 257/315; 257/326; 257/379; 257/532; 257/904; 257/E27.085; 257/E29.3

(58) Field of Classification Search .............. 257/296, 257/298, 300, 301, 315, 326, E27.085, E27.092, 257/E27.093, E27.102, E27.103, E27.105, 257/379, 532, 904, E29.3
See application file for complete search history.

(56) References Cited

U.S. PATENT DOCUMENTS 5,027,173 A * 6/1991 Satoh ...................... 257/302
5,196,722 A * 3/1993 Bergendahl et al. ...... 257/304

* cited by examiner

*Primary Examiner*—Minhloan Tran
*Assistant Examiner*—Benjamin Tzu-Hung Liu
(74) *Attorney, Agent, or Firm*—Tung & Associates

(57) ABSTRACT

A semiconductor product and a method for fabricating the semiconductor product employ a semiconductor substrate. The semiconductor substrate has a logic region having a logic device formed therein, a non-volatile memory region having a non-volatile memory device formed therein and a volatile memory device having a volatile memory device formed therein. Gate electrode and capacitor plate layer components within each of the devices may be formed simultaneously incident to patterning of a single blanket gate electrode material layer

22 Claims, 2 Drawing Sheets

1

SEMICONDUCTOR PRODUCT INCLUDING LOGIC, NON-VOLATILE MEMORY AND VOLATILE MEMORY DEVICES AND METHOD FOR FABRICATION THEREOF

BACKGROUND OF THE INVENTION

1. Field of the Invention

The invention relates generally to semiconductor products. More particularly, the invention relates to semiconductor products with multiple semiconductor device types integrated therein.

2. Description of the Related Art

As semiconductor technology has evolved, it has become increasingly common to provide enhanced functionality within semiconductor products. Enhanced functionality may often be achieved by increasing a number of semiconductor devices integrated within a fixed semiconductor substrate surface area. In addition, enhanced functionality may also be achieved by increasing a number of semiconductor device types fabricated within a semiconductor product. The latter approach may often provide enhanced functionality that is not otherwise achievable by an enhanced scaled integration of existing semiconductor device types.

While enhanced functionality by increasing a number of semiconductor device types is thus particularly desirable when fabricating semiconductor products, it is nonetheless not entirely without problems. In particular when enhanced functionality is predicated upon increased numbers of semiconductor device types fabricated within a semiconductor product, it is often difficult to efficiently integrate the increasing number of semiconductor device types.

The invention is thus directed to efficiently providing semiconductor products with enhanced functionality resulting from increased numbers of semiconductor device types.

SUMMARY OF THE INVENTION

A first object of the invention is to provide a semiconductor product with enhanced functionality.

A second object of the invention is to provide a semiconductor product in accord with the first object of the invention, where the semiconductor product is efficiently fabricated.

In accord with the objects of the invention, the invention provides a semiconductor product and a method for fabricating the semiconductor product.

In accord with the invention, the semiconductor product is formed upon a semiconductor substrate. The semiconductor product includes each of a logic device, a non-volatile memory device and a volatile memory device formed within the semiconductor substrate. The invention thus provides in particular a logic device integrated with both a non-volatile memory device and a volatile memory device.

A method for fabricating the semiconductor product generally employs multiple gate electrode material layers. A single of the multiple gate electrode material layers is patterned to simultaneously yield a series of gate electrodes within each of the logic device, the non-volatile memory device and the volatile memory device, as well as a capacitor plate layer within the volatile memory device.

The invention provides a semiconductor product efficiently fabricated with enhanced functionality.

The invention realizes the foregoing object within the context of a semiconductor product including a logic semiconductor device, a non-volatile memory semiconductor device and a volatile memory semiconductor device. In a second instance, the invention realizes the foregoing object within a method that provides for patterning a single gate electrode material layer to form a gate electrode within each of the logic semiconductor device, the non-volatile memory semiconductor device and volatile memory semiconductor device.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention provides a semiconductor product efficiently fabricated with enhanced functionality.

The invention realizes the foregoing object within the context in a first instance of a semiconductor product including a logic semiconductor device, a volatile memory semiconductor device and a non-volatile memory semiconductor device. In a second instance, the invention realizes the foregoing object within the context of a method that provides for patterning a single gate electrode material layer to form a gate electrode within each of the logic semiconductor device, the non-volatile memory semiconductor device and the volatile memory semiconductor device.

Figure 1:
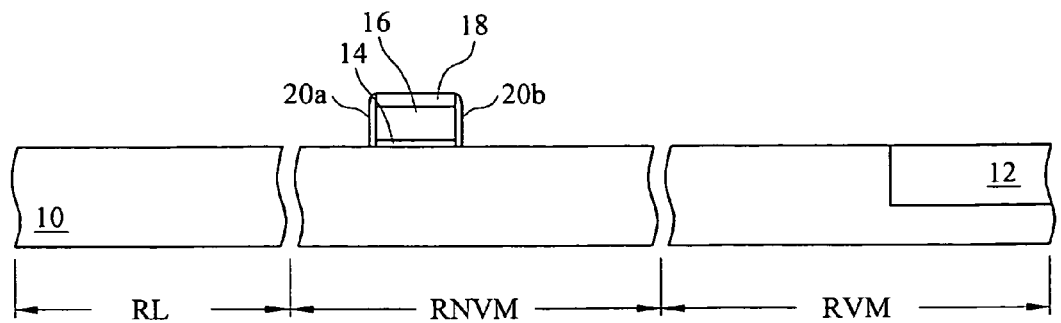
FIG. 1, FIG. 2, FIG. 3, FIG. 4, FIG. 5 and FIG. 6 show a series of schematic cross-sectional diagrams illustrating the results of progressive stages in fabricating a semiconductor product in accord with a preferred embodiment of the invention.

FIG. 1 to FIG. 6 show a series of schematic cross-sectional diagrams illustrating the results of progressive stages in fabricating a semiconductor product in accord with a preferred embodiment of the invention. FIG. 1 shows a schematic cross-sectional diagram of the semiconductor product at an early stage in its fabrication in accord with the preferred embodiment of the invention.

FIG. 1 shows a semiconductor substrate 10 divided into a logic region RL, a non-volatile memory region RNVM and a volatile memory region RVM. An isolation region 12 is formed into the semiconductor substrate 10 within the volatile memory region RVM. A select gate electrode stack including a select gate dielectric layer 14, a select gate electrode 16 and a dielectric capping layer 18 is formed upon the semiconductor substrate 10 within the non-volatile memory region RNVM. A pair of spacer layers 20a and 20b is formed adjoining a pair of opposite sidewalls of the select gate electrode stack.

The semiconductor substrate 10 may be formed of semiconductor materials as are conventional in the semiconductor product fabrication art. The semiconductor materials may include, but are not limited to silicon semiconductor materials, germanium semiconductor materials, silicon-germanium alloy semiconductor materials and semiconductor-on-insulator semiconductor materials.

The select gate dielectric layer 14 may be formed of gate dielectric materials as are conventional in the semiconductor product fabrication art. They will typically include, but not be limited to silicon oxide dielectric materials and silicon oxynitride dielectric materials. Typically, the select gate dielectric layer 14 is formed to a thickness of from about 10 to about 100 angstroms.

The select gate electrode 16 is typically formed of a conductor material such as but not limited to a doped polysilicon conductor material (i.e., having a dopant concentration of from about 1E18 to about 1E22 dopant atoms per cubic centimeter). Other conductor materials, such as polycides, metals and metal alloys may also be employed. Typically, the select gate electrode 16 is formed to a thickness of from about 1000 to about 2500 angstroms.

The capping dielectric layer 18 and the pair of spacer layers 20*a* and 20*b* may be formed of dielectric materials such as silicon oxide dielectric materials, silicon nitride dielectric materials and composites thereof. Typically, the capping dielectric layer 18 is formed to a thickness of from about 200 to about 1000 angstroms. Typically, the pair of spacer layers 20*a* and 20*b* is formed employing an anisotropic etching method.

Figure 2:
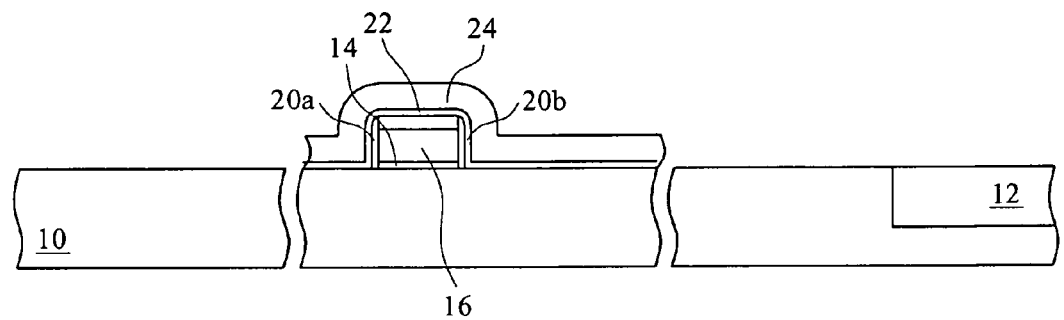

FIG. 2 first shows the results of forming a tunneling dielectric layer 22 upon exposed portions of: (1) the select gate electrode stack; (2) the pair of spacer layers 20*a* and 20*b*; and (3) exposed portions of the semiconductor substrate 10, within the non-volatile memory region RNVM of the semiconductor substrate 10, but neither the logic region RL nor the volatile memory region RVM of the semiconductor substrate 10. A floating gate electrode material layer 24 is formed aligned upon the tunneling dielectric layer 22, and also formed in only the non-volatile memory region RNVM of the semiconductor substrate.

The tunneling dielectric layer 22 may be formed of a silicon oxide dielectric material, a silicon nitride dielectric material or a composite thereof. Typically, the tunneling dielectric layer 22 is formed of a silicon oxide dielectric material formed to a thickness of from about 10 to about 200 angstroms. Like the select gate electrode 16, the floating gate electrode material layer 24 is typically also formed of a doped polysilicon material. Preferably, the floating gate electrode material layer 24 is formed to a thickness of from about 1000 to about 2500 angstroms.

Figure 3:
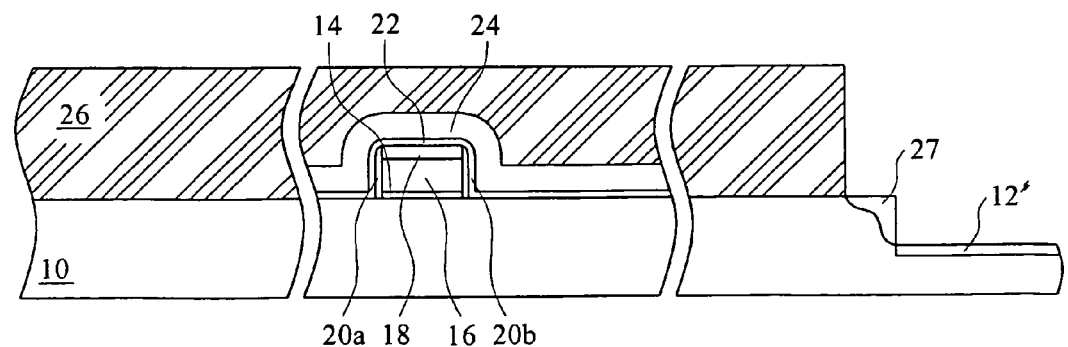

FIG. 3 first shows a patterned photoresist layer 26 that masks most of the semiconductor substrate 10 as illustrated in FIG. 2. Left unmasked is: (1) a portion of the active region of the semiconductor substrate 10 within the volatile memory region RVM; as well as (2) the isolation region 12.

The patterned photoresist layer 26 may be formed of photoresist materials as are conventional in the art, including positive photoresist materials and negative photoresist materials.

FIG. 3 also shows the results of selectively etching the isolation region 12 to form an etched isolation region 12' of diminished thickness dimension that exposes a sidewall of the active region of the semiconductor substrate 10 within the volatile memory region RVM. The etching may be undertaken employing etchants as are conventional in the semiconductor product fabrication art, including wet chemical etchants and dry plasma etchants. Typically, about 60 to about 80 percent of the depth of the isolation region (i.e., as originally formed to a thickness of from about 5000 to about 6000 angstroms) is etched when forming the etched isolation region 12'.

Finally, FIG. 3 shows a doped region 27 formed into a corner of the active region that adjoins the isolation trench and the etched isolation region 12'. The doped region 27 is typically formed by ion implantation of an appropriate dopant to provide the doped region 27 of a dopant concentration of from about 1E15 to about 1E22 dopant atoms per cubic centimeter. The doped region 27 serves as a capacitor node layer within a storage capacitor formed incident to further processing of the semiconductor product of FIG. 3.

Figure 4:
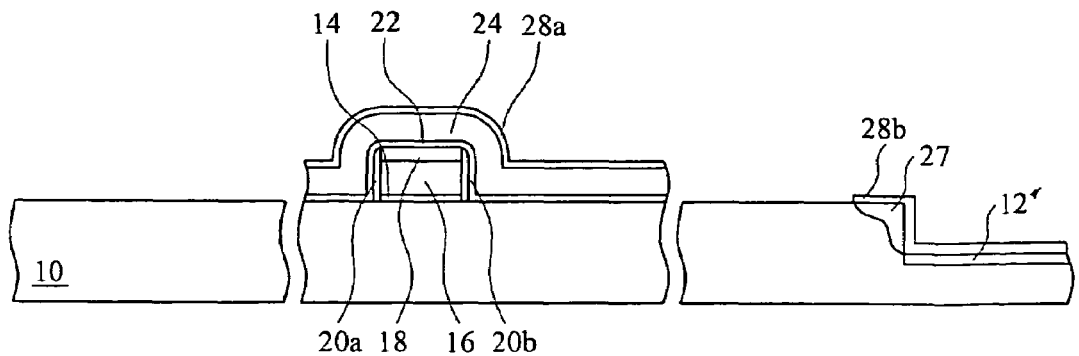

FIG. 4 first shows the results of stripping the patterned photoresist layer 26 from the semiconductor product of FIG. 3. The patterned photoresist layer 26 may be stripped employing methods and materials as are conventional in the semiconductor product fabrication art, including wet chemical and dry plasma methods and materials.

FIG. 4 next shows an intergate electrode dielectric layer 28*a* formed upon the floating gate electrode material layer 24 within the non-volatile memory region RNVM of the semiconductor substrate 10 and a capacitor dielectric layer 28*b* formed bridging from the active region to the etched isolation region 12' within the isolation trench within the volatile memory region RVM of the semiconductor substrate 10. The capacitor dielectric layer 28*b* covers the doped region 27, including a sidewall of the isolation trench.

The intergate electrode dielectric layer 28*a* and the capacitor dielectric layer 28*b* may be formed of the same or different dielectric materials. They may both be formed of a silicon oxide/silicon nitride/silicon oxide laminate formed to a thickness of from about 10 to about 150 angstroms. Alternatively, the capacitor dielectric layer 28*b* only may be formed of a higher dielectric constant dielectric material such as to enhance charge storage. Such higher dielectric constant dielectric materials may include, but are not limited to barium strontium titanate dielectric materials and lead zirconate titanate dielectric materials.

Figure 5:
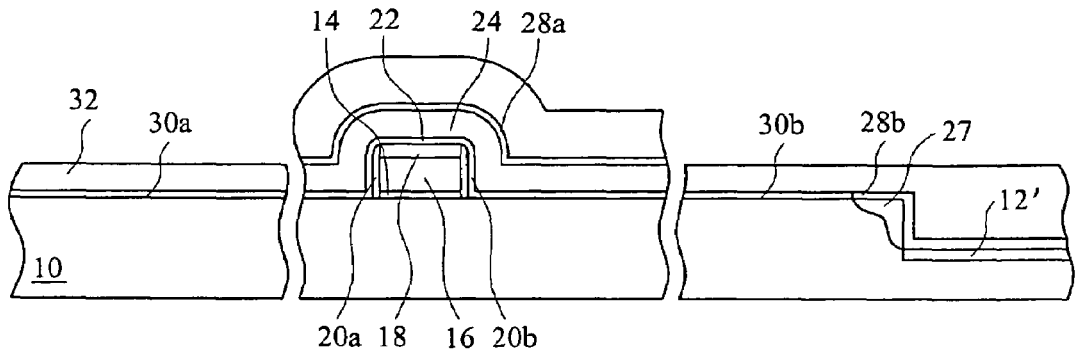

FIG. 5 first shows a pair of gate dielectric layers 30*a* and 30*b*, formed respectively upon exposed portions of the active regions of the semiconductor substrate 10 within the logic region RL and the volatile memory region RVM. FIG. 5 also shows a blanket gate electrode and capacitor plate material layer 32 upon the resulting semiconductor product. The blanket gate electrode and capacitor plate material layer 32 is formed covering the logic region RL, the non-volatile memory region RNVM and the volatile memory region RVM of the semiconductor substrate 10.

The pair of gate dielectric layers 30*a* and 30*b* is typically formed of a silicon oxide dielectric material formed to a thickness of from about 10 to about 150 angstroms.

The blanket gate electrode and capacitor plate material layer 32 is typically formed of a doped polysilicon material. It is typically formed to a thickness of from about 1000 to about 2500 angstroms.

Figure 6:
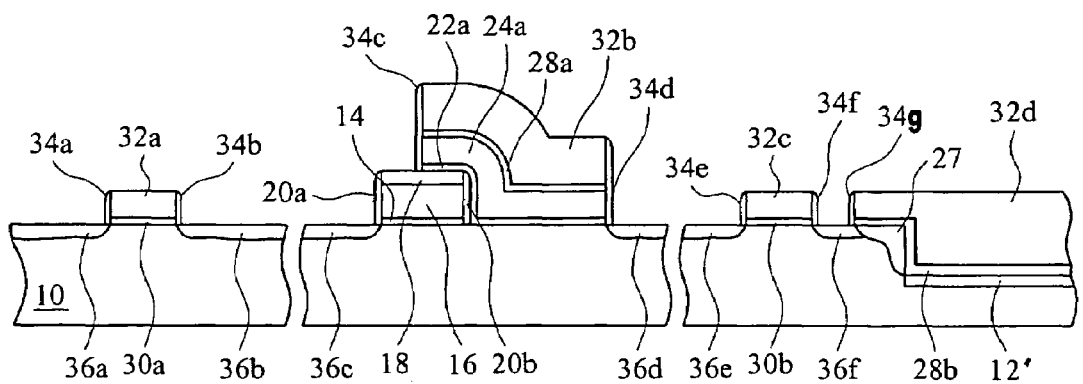

FIG. 6 first shows the results of patterning the blanket gate electrode and capacitor plate material layer 32, the pair of gate dielectric layers 30*a* and 30*b*, the intergate electrode dielectric layer 28*a*, the floating gate electrode material layer 24 and the tunneling dielectric layer 22 while employing a mask layer that is not otherwise illustrated. The patterning yields: (1) a gate electrode 32*a* aligned upon a patterned gate dielectric layer 30*a* within the logic region RL of the semiconductor substrate 10; (2) a control gate electrode 32*b* aligned upon a patterned intergate electrode dielectric layer 28*a* further aligned upon a floating gate electrode 24*a* further aligned upon a patterned tunneling dielectric layer 22*a* within the non-volatile memory region RNVM of the semiconductor substrate 10; and (3) a gate electrode 32*c* aligned upon a patterned gate dielectric layer 30*b*, and a capacitor plate layer 32*d* separated therefrom, within the volatile memory region RVM of the semiconductor substrate 10.

FIG. 6 also shows a series of second spacer layers 34*a*, 34*b*, 34*c*, 34*d*, 34*e*, 34*f* and 34*g* formed upon a series of sidewalls of the foregoing series of patterned layers. The foregoing series of patterned layers may be formed employing methods and materials analogous or equivalent to the methods and materials employed for forming the pair of spacer layers 20a and 20b adjoining the pair of sidewalls of the select gate stack.

Finally, FIG. 6 shows a series of source/drain regions 36a, 36b, 36c, 36d, 36e and 36f formed into the semiconductor substrate 10 within the logic region RL, the non-volatile memory region RNVM and the volatile memory region RVM, at areas not covered by other structures. The series of source/drain regions 36a, 36b, 36c, 36d, 36e and 36f is formed employing a two step ion implantation method. The two step method employs a lighter ion implant dose prior to forming the series of spacer layers 34a, 34b, 34c, 34d, 34e, 34f, and 34g and a heavier ion implant dose thereafter. The lighter dose provides a series of lightly doped extension regions, as are conventional in the semiconductor product fabrication art.

FIG. 6 illustrates a semiconductor product in accord with a preferred embodiment of the invention. The semiconductor product has a logic region RL (i.e., a logic cell) having a logic field effect transistor device formed therein. The semiconductor product also has a non-volatile memory region RNVM (i.e. a non-volatile memory cell) having a non-volatile memory device formed therein. The non-volatile memory device is a stacked gate (i.e., control gate and floating gate) field effect transistor device with an adjacent select gate. The semiconductor product finally has a volatile memory region RVM (i.e., a volatile memory cell) having a field effect transistor device connected through a source/drain region to a doped region that provides a capacitor node within a storage capacitor. This provides a one-transistor random access memory (1T-RAM) cell. The storage capacitor is formed with the capacitor node including a sidewall of an isolation trench. The capacitor plate is embedded in part within the isolation trench, but separated from the floor thereof by an etched isolation region. Thus, the invention is directed in particular towards integration of a logic device with a non-volatile memory device and a volatile memory device within a semiconductor product.

Within the semiconductor product, a single blanket gate electrode material layer is patterned simultaneously to form a series of gate electrodes within the logic, non-volatile memory and volatile memory devices within the logic region, the non-volatile memory region and the volatile memory region. The single blanket gate electrode material layer is also simultaneously patterned to form a capacitor plate within the capacitor within the volatile memory region. The use of the single blanket gate electrode material layer and its simultaneous patterning to form various components provides for efficiency when fabricating the semiconductor product of the preferred embodiment of the invention.

The preferred embodiment of the invention is illustrative of the invention rather than limiting of the invention. Revisions and modifications may be made to methods, materials, structures and dimensions of a semiconductor product in accord with the preferred embodiment of the invention, while still providing a semiconductor product in accord with the invention, further in accord with the accompanying claims.

What is claimed is:

1. A semiconductor product comprising:
   a semiconductor substrate
   a logic region having a logic device on the semiconductor substrate;
   a non-volatile memory region having a non-volatile memory device on and overlying the semiconductor substrate, said non-volatile memory device comprising a control gate electrode overlying a floating gate electrode with an intergate dielectric layer therebetween; and
   a 1T-RAM region having a 1T-RAM device, said 1T-RAM region comprising a transistor on said semiconductor substrate and a capacitor comprising an upper capacitor electrode overlying a capacitor dielectric layer disposed within a trench adjacent said transistor;
   wherein said intergate electrode dielectric and said capacitor dielectric layer comprise patterned portions of the same dielectric layer.

2. The product of claim 1 wherein the logic device is a field effect transistor device.

3. The product of claim 1 wherein the non-volatile memory device is an electrically programmable memory device.

4. The product of claim 1 wherein the 1T-RAM region comprises:
   said trench in said semiconductor substrate having at its bottom a shallow trench isolation region;
   a junction in a sidewall of the trench, said junction comprising an upper corner of said trench;
   said capacitor dielectric layer overlying the sidewall; and
   said upper capacitor electrode on top of the capacitor dielectric layer.

5. The product of claim 1 wherein a gate electrode within the logic region, a control gate electrode within the non-volatile memory region and the upper capacitor electrode within the 1T-RAM region comprise patterned portions of the same electrode layer.

6. The product of claim 1 wherein a gate electrode within the 1T-RAM region and a gate electrode within the logic region comprise patterned portions of the same electrode layer.

7. The product of claim 1 junction comprises a sidewall of an active region of the semiconductor substrate as a capacitor node.

8. A method for forming a semiconductor product comprising:
   providing a semiconductor substrate; and
   defining within the semiconductor substrate:
   a logic region and forming a logic device on the semiconductor substrate;
   a non-volatile memory region and forming a non-volatile memory device on and overlying the semiconductor substrate; and
   a 1T-RAM region and, said 1T-RAM region comprising a transistor on said semiconductor substrate and a capacitor comprising an upper capacitor electrode overlying a capacitor dielectric layer disposed within a trench adjacent said transistor;
   wherein said intergate electrode dielectric layer and said capacitor dielectric layer comprise patterned portions of the same dielectric layer and are defined at the same time employing a single mask.

9. The method of claim 8 wherein the step of providing the semiconductor substrata comprises providing the semiconductor substrate formed from a semiconductor material selected from the group consisting of silicon, germanium, silicon-germanium alloy and semiconductor-on-insulator semiconductor materials.

10. The method of claim 8 wherein the step of forming the logic device comprises forming a field effect transistor device.

11. The method of claim 8 wherein the step of forming the non-volatile memory device comprises forming an electrically programmable memory device.

12. The method of claim 8 wherein the step of forming the 1T-RAM device comprises forming a single transistor and a single capacitor 1T-RAM device.

13. A method for forming a semiconductor product comprising:
providing a silicon semiconductor substrate;
defining within the silicon semiconductor substrate a logic region and forming a logic device on the semiconductor substrate;
defining within the silicon semiconductor substrate a non-volatile memory region and forming a non-volatile memory device on and overlying the semiconductor substrate, said non-volatile memory device comprising a control gate electrode overlying a floating gate electrode with an intergate dielectric layer therebetween;
defining within the silicon semiconductor substrate a 1T-RAM region and forming a 1T-RAM device, said 1T-RAM region comprising a transistor on said semiconductor substrate and a capacitor comprising an upper capacitor electrode overlying a capacitor dielectric layer disposed within a trench adjacent said transistor;
wherein a gate electrode, said control gate electrode and the upper capacitor electrode comprise patterned portions of the same electrode layer that are defined at the same time employing a single mask.

14. The method of claim 13 wherein the step of forming the logic device comprises forming a field effect transistor device.

15. The method of claim 13 wherein the step of forming the non-volatile memory device comprises forming an electrically programmable device.

16. The method of claim 13 wherein the step of forming the 1T-RAM device comprises forming a single transistor and a single capacitor 1T-RAM device.

17. The method of claim 13 wherein the step of forming the logic device, the non-volatile memory device and the 1T-RAM device comprises forming the single capacitor while employing a sidewall of an active region of the silicon semiconductor substrate as a capacitor node layer.

18. The method of claim 13, wherein said intergate electrode dielectric layer and said capacitor dielectric layer comprise patterned portions of the same dielectric layer that are defined at the same time employing a single mask.

19. A semiconductor product comprising:
a silicon semiconductor substrate;
a logic region having a logic device on the semiconductor substrate;
a non-volatile memory region having a nonvolatile memory device on and overlying the semiconductor substrate, said non-volatile memory device comprising a control gate electrode overlying a floating gate electrode with an intergate dielectric layer therebetween;
a 1T-RAM region having a 1T-RAM device, said 1T-RAM region comprising a transistor on said semiconductor substrate and a capacitor comprising an upper capacitor electrode overlying a capacitor dielectric layer disposed at least partially within a trench adjacent said transistor;
wherein a gate electrode within the logic region, said control gate and the upper capacitor electrode comprise patterned portions of the same electrode layer that are defined at the same time employing a single mask.

20. The product of claims 19, wherein said intergate electrode dielectric layer and said capacitor dielectric layer comprise patterned portions of the same dielectric layer.

21. The product of claim 19 wherein a gate electrode within the 1T-RAM region and a gate electrode within the logic comprise patterned portions of the same electrode layer.

22. The product of claim 19 wherein the 1T-RAN region comprises:
said trench in said semiconductor substrate having at its bottom a shallow trench isolation region;
a junction in a sidewall of the trench, said junction comprising an upper corner of said trench;
said capacitor dielectric layer overlying the sidewall; and
said upper capacitor electrode on top of the capacitor dielectric layer.

* * * * *